US011946138B2

(12) United States Patent
Lee et al.

(10) Patent No.: US 11,946,138 B2
(45) Date of Patent: Apr. 2, 2024

(54) VACUUM VALVE AND APPARATUS FOR FABRICATING SEMICONDUCTOR HAVING THE SAME

(71) Applicant: SAMSUNG ELECTRONICS CO., LTD., Suwon-si (KR)

(72) Inventors: Jaeheung Lee, Hwaseong-si (KR); Junseong Park, Seoul (KR); Kanghun Lee, Hwaseong-si (KR); Seongwan Kim, Hwaseong-si (KR); Hyouncheol Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/543,807

(22) Filed: Dec. 7, 2021

(65) Prior Publication Data

US 2022/0282372 A1 Sep. 8, 2022

(30) Foreign Application Priority Data

Mar. 4, 2021 (KR) .......................... 10-2021-0028988

(51) Int. Cl.
*C23C 16/455* (2006.01)
*C23C 16/52* (2006.01)
(Continued)

(52) U.S. Cl.
CPC ........ *C23C 16/45525* (2013.01); *C23C 16/52* (2013.01); *H01L 21/67017* (2013.01);
(Continued)

(58) Field of Classification Search
CPC .............. C23C 16/45525; C23C 16/52; C23C 16/45546; C23C 16/4412;
(Continued)

(56) References Cited

U.S. PATENT DOCUMENTS 2,701,581 A * 2/1955 Carlson ................... F16K 15/18
137/533.27
3,298,393 A * 1/1967 Mosier .................... F16K 15/06
137/513.3
(Continued)

FOREIGN PATENT DOCUMENTS

JP 2020-153456 A 9/2020
KR 10-2000-0035086 A 6/2000
(Continued)

OTHER PUBLICATIONS

Uwe Schloßer, et al., "Some remarks on the removal of adhering particles by oscillating air flows", Deutsches Textilforschungszentrum Nord-West e. V., Krefeld, Germany, (Jan. 2009).
(Continued)

*Primary Examiner* — Minh Q Le
(74) *Attorney, Agent, or Firm* — Fish & Richardson P.C.

(57) ABSTRACT

A vacuum valve includes a valve flange having a first port, a second port, and a valve seat in a space between the first port and the second port, a valve body in the valve flange, the valve body having a contact surface facing the valve seat, and the valve body being moveable to have the contact surface contact the valve seat and to be separated from the valve seat, a disk on the contact surface of the valve body, the disk having an inclined surface inclined toward the second port, and an actuator connected to the valve flange, the actuator being configured to apply a driving force to the valve body to move the contact surface of the valve body into or out of contact with the valve seat.

20 Claims, 13 Drawing Sheets

(51) Int. Cl.
*H01L 21/67* (2006.01)
*C23C 16/44* (2006.01)
*F16K 1/36* (2006.01)
*F16K 31/126* (2006.01)
*F16K 51/02* (2006.01)

(52) U.S. Cl.
CPC .... *H01L 21/67253* (2013.01); *C23C 16/4412* (2013.01); *C23C 16/45546* (2013.01); *F16K 1/36* (2013.01); *F16K 31/126* (2013.01); *F16K 51/02* (2013.01)

(58) Field of Classification Search
CPC ......... H01L 21/67017; H01L 21/67253; F16K 1/36; F16K 51/02; F16K 31/126
USPC ........... 137/526, 487.5, 488; 251/335.3, 333, 251/319
See application file for complete search history.

(56) References Cited

U.S. PATENT DOCUMENTS

| | | | |
|---|---|---|---|
| 4,431,159 A * | 2/1984 | Stubbs | F16K 1/34 137/554 |
| 5,915,410 A * | 6/1999 | Zajac | F16K 1/54 137/341 |
| 6,041,814 A * | 3/2000 | Kouketsu | F16K 31/1262 137/488 |
| 6,289,737 B1 * | 9/2001 | Kouketsu | G05D 16/2093 73/714 |
| 6,508,268 B1 | 1/2003 | Kouketsu | |
| 6,877,715 B2 * | 4/2005 | Kajitani | F16K 41/10 251/63.5 |
| 7,117,886 B2 | 10/2006 | Kajitani et al. | |
| 7,163,025 B2 * | 1/2007 | Kajitani | F16K 51/02 251/285 |
| 7,806,135 B2 * | 10/2010 | Kaneko | F16K 31/1635 137/512.5 |
| 7,862,002 B2 | 1/2011 | Naitoh et al. | |
| 9,328,836 B2 | 5/2016 | Schultz et al. | |
| 9,816,622 B2 * | 11/2017 | Chiba | F16K 27/02 |
| 2002/0134441 A1 * | 9/2002 | Kusumoto | F16K 51/02 137/625.3 |
| 2007/0045584 A1 * | 3/2007 | Fortner | F16K 1/36 251/245 |
| 2020/0248685 A1 * | 8/2020 | Yamada | F16K 31/1262 |

FOREIGN PATENT DOCUMENTS

| | | |
|---|---|---|
| KR | 10-2018-0043729 A | 4/2018 |
| KR | 10-1873560 B1 | 7/2018 |

OTHER PUBLICATIONS

Daichi Matsumoto, et al. "Two-dimensional fluid dynamics in a sharply bent channel: Laminar flow, separation bubble, and vortex dynamics", Phys. Fluids 28, 103602 (2016).

* cited by examiner

VACUUM VALVE AND APPARATUS FOR FABRICATING SEMICONDUCTOR HAVING THE SAME

CROSS-REFERENCE TO RELATED APPLICATION

This application claims benefit of priority to Korean Patent Application No. 10-2021-0028988 filed on Mar. 4, 2021, in the Korean Intellectual Property Office, the disclosure of which is incorporated herein by reference in its entirety.

BACKGROUND

1. Field

The present disclosure relates to a vacuum valve and a semiconductor manufacturing apparatus having the same.

2. Description of the Related Art

In general, a semiconductor manufacturing process includes a series of unit processes, e.g., a deposition process, a photographic process, an etching process, an ion implantation process, and the like. Some unit processes (e.g., a deposition process and a diffusion process) are performed in a chamber (or "tube") in a vacuum state, and a semiconductor manufacturing apparatus, e.g., a chemical vapor deposition apparatus, an atomic layer deposition (ALD) apparatus, and a diffusion furnace, may be used. In such a semiconductor manufacturing apparatus, a vacuum valve may be disposed between a vacuum chamber in which a wafer is disposed and a vacuum pump to control pressure in the vacuum chamber.

SUMMARY

According to an aspect of the present disclosure, a vacuum valve is provided. The vacuum valve may include a valve flange having a first port and a second port, and a valve seat located in a space between the first port and the second port, a valve body disposed in the valve flange, having a contact surface capable of contacting the valve seat, and configured to allow the contact surface to contact the valve seat and to be separated from the valve seat, a disk disposed on the contact surface of the valve body, and having a surface inclined toward the second port, and an actuator applying driving force for moving the contact surface of the valve body into or out of contact with the valve seat to the valve body.

According to an aspect of the present disclosure, a vacuum valve is provided. The vacuum valve may include a valve flange having a first port and a second port, and a valve seat provided on a flow path between the first and second ports, a valve body disposed in the valve flange, and having a contact surface blocking the flow path when contacting the valve seat, and configured to allow the contact surface to be separated from the valve seat, a disk disposed on a contact surface of the valve body, located in the first port when the contact surface contacts the valve seat, and having a non-flat surface, an actuator having an output shaft connected to the valve body, and applying driving force to the valve body through the output shaft, and a bellows surrounding the output shaft, and configured to be expanded and contracted according to the driving force.

According to an aspect of the present disclosure, a semiconductor manufacturing apparatus is provided. The semiconductor manufacturing apparatus may include a chamber having an internal space in which a wafer is disposed, a reactive gas supply line supplying reactive gas to the chamber, a vacuum pump pumping residual gas externally after the reaction in the chamber, a first exhaust line connected to the chamber, a second exhaust line connected to the vacuum pump, and a vacuum valve mounted between the first and second exhaust lines, and configured to open and close a flow path of the residual gas, wherein the vacuum valve includes, a valve flange having first and second ports respectively connected to the first and second exhaust lines, and a valve seat disposed toward the first port, a valve body disposed in the valve flange, having a contact surface capable of contacting the valve seat, and configured to contact the valve seat and be separated from the valve seat, a disk disposed on the contact surface of the valve body, and having a surface inclined toward the second port, and an actuator applying driving force for moving the contact surface of the valve body into or out of contact with the valve seat to the valve body.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
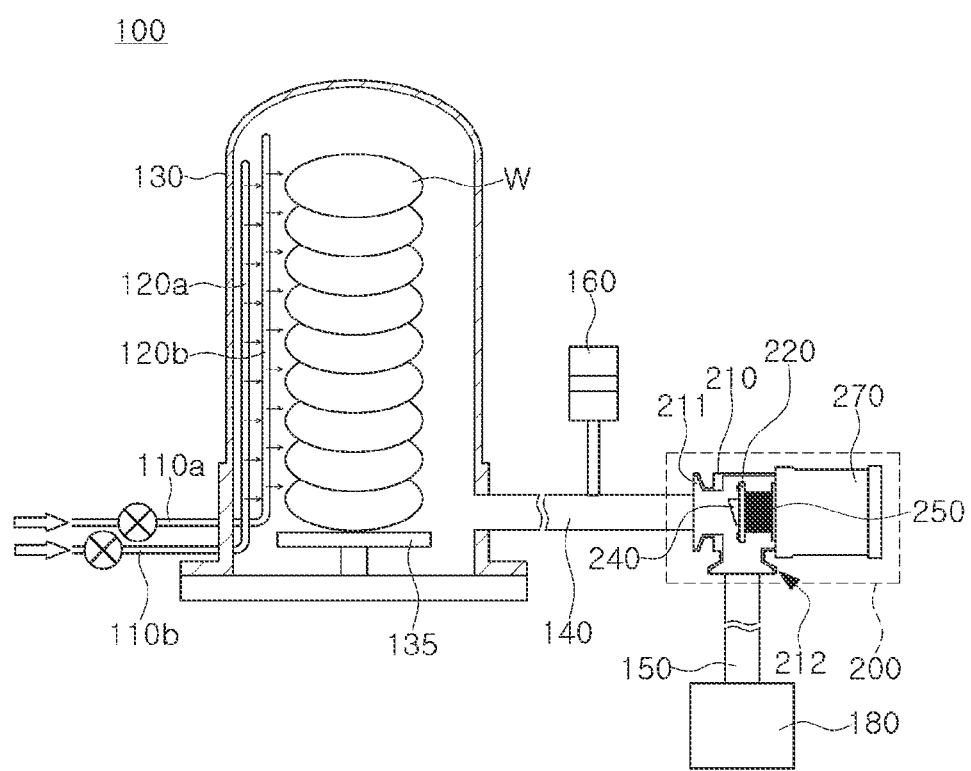
FIG. 1 is a schematic diagram of a semiconductor manufacturing apparatus according to an example embodiment.

FIG. 1 is a schematic diagram of a semiconductor manufacturing apparatus according to an example embodiment.

Referring to FIG. 1, a semiconductor manufacturing apparatus 100 according to the present example embodiment may include a chamber 130 with an internal space, in which a plurality of wafers W is disposed, supply lines 110a and 110b for supplying reactive gas into the chamber 130, a vacuum pump 180 pumping to the outside residual gas after the reaction in the chamber 130, first and second exhaust lines 140 and 150 respectively connected to the chamber 130 and the vacuum pump 180, and a vacuum valve 200 mounted between the first and second exhaust lines 140 and 150.

The semiconductor manufacturing apparatus 100 according to the present example embodiment may be a vapor deposition apparatus for depositing a desired thin film by supplying and reacting reactive gas containing an element constituting a thin film onto a wafer W. For example, the semiconductor manufacturing apparatus 100 may be a chemical vapor deposition apparatus or an atomic layer deposition (ALD) apparatus.

The chamber 130 may include an inner space in which a wafer support 135 is disposed to support the plurality of wafers W. The chamber 130 may further include an inlet connected to the supply lines 110a and 110b, and an outlet to which the first exhaust line 140 is connected. The supply lines 110a and 110b, as well as the first exhaust line 140, may be external with respect to the chamber 130. The chamber 130 employed in the present example embodiment may be a vertical chamber, but embodiments are not limited thereto.

The wafer support 135 may be configured such that the plurality of wafers W may be disposed at regular intervals in a vertical direction, e.g., the plurality of wafers W may be spaced apart from each other along a direction normal to an upper surface of the wafer support 135. In the present example embodiment, the supply lines 110a and 110b may include a first supply line 110a and a second supply line 110b, but are not limited thereto, and may be formed of a plurality of other lines. The first and second supply lines 110a and 110b may be connected to first and second injection nozzle portions 120a and 120b inside the chamber 130, respectively. The first and second injection nozzle portions 120a and 120b may be configured to supply reactive gas to each of the wafers W arranged in the vertical direction.

In the semiconductor manufacturing apparatus 100, the vacuum valve 200 may be used as an apparatus for controlling vacuum pressure in the chamber 130. By using the vacuum valve 200 together with the vacuum pump 180, an internal space of the chamber 130 may be changed/maintained to a reduced pressure/vacuum state, or residual gas may be discharged, e.g., purged, from the internal space of the chamber 130 externally, e.g., to the outside, or a vacuum state may be released.

A pressure sensor 160 may be mounted on a line branched from the first exhaust line 140. For example, the pressure sensor 160 may include a capacitance manometer. An opening and closing operation of the vacuum valve 200 may be variously implemented according to a deposition method. For example, in the case of a chemical vapor deposition (CVD) process, the vacuum valve 200 may be opened so that the internal space of the chamber 130 is depressurized by the vacuum pump 180. In another example, in a process of supplying a reactive gas and forming a thin film, the vacuum valve 200 may be closed to maintain a vacuum state, and after the reaction, the vacuum valve 200 may be opened to discharge the residual gas.

In general, during an opening and closing operation of a vacuum valve, a pressure behavior and a change in gas flow may cause particle generation and backflow. In particular, in the case of the ALD process, unlike the CVD process, the reactive gas is supplied in pulse units and deposited in atomic layers, and vacuum pumping and purge are repeatedly performed for each unit, so that a more complicated pressure change may be involved than in the CVD process, as will be described with reference to FIG. 2.

Figure 2:
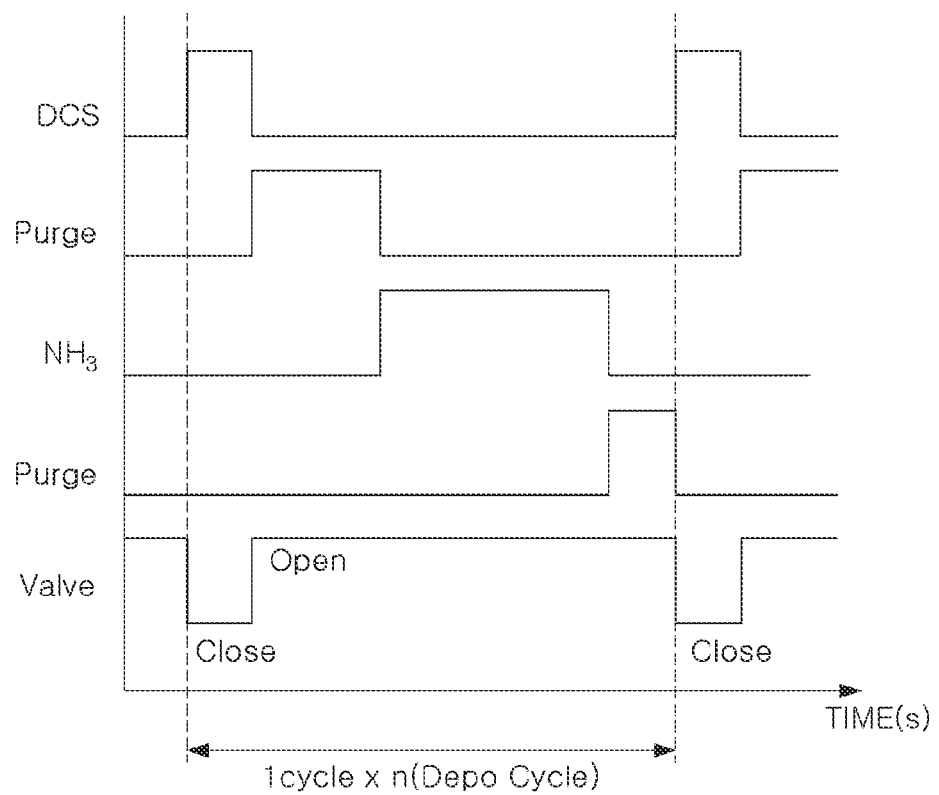
FIG. 2 is a timing chart of an atomic layer deposition process according to an example embodiment.

FIG. 2 is a timing chart illustrating one cycle of an ALD process for forming a silicon nitride film.

For example, referring to FIG. 2, in a vacuum state in which a vacuum valve is closed, dichlorosilane (DCS) is supplied into the chamber through a first supply line, and in a state in which the vacuum valve is opened, the residual gas may be purged. Ammonia ($NH_3$) is supplied through the second supply line, while the vacuum valve is still open, followed by an additional purge through the open vacuum valve, and closing of the vacuum valve. One cycle of atomic layer deposition after reaction may be repeatedly performed.

As described above, in the ALD process, the opening and closing operation of the vacuum valve is repeated in each cycle and complicated pressure changes are involved, so compared to the CVD process, a temporary back pressure and a local backward flow of the gas may potentially occur. Due to the back pressure and the backward flow, a byproduct, e.g., particles, in the chamber may be transferred to the wafers to cause contamination or the reactive gas may penetrate into the first and second injection nozzle portions to generate additional particles.

In contrast, the vacuum valve 200 according to the present example embodiment includes a valve body 220 with a disk 240 to prevent particle generation and backward flow, as will be described in more detail below with reference to FIGS. 3A and 3B.

Figure 3A:
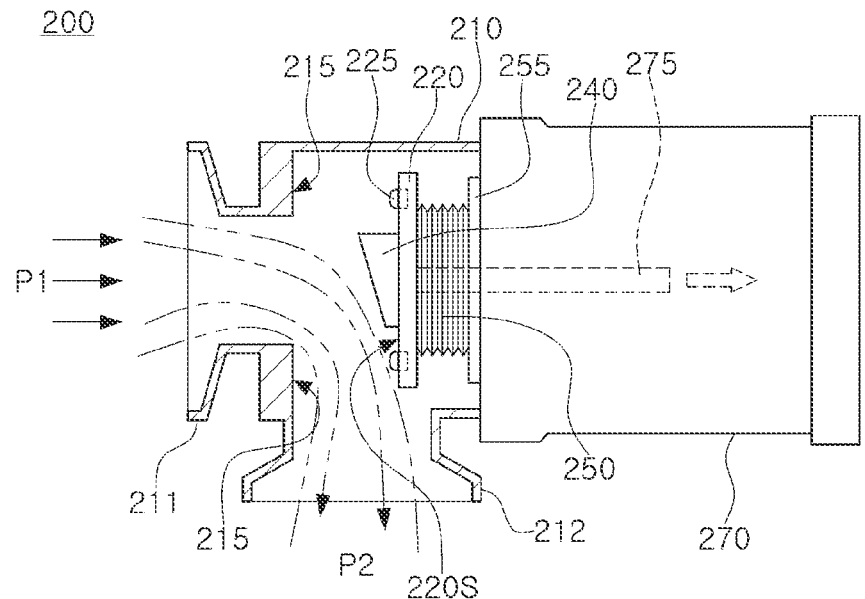
FIGS. 3A and 3B are cross-sectional views of an open state and a closed state, respectively, of the vacuum valve of FIG. 1.
Figure 3B:
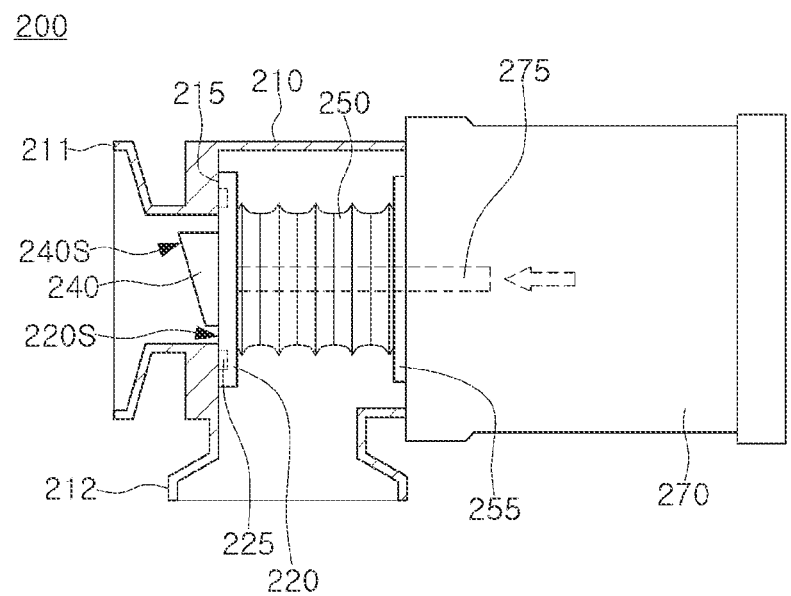

FIGS. 3A and 3B are enlarged cross-sectional views of the vacuum valve 200 of FIG. 1, showing open and closed states, respectively.

Referring to FIGS. 3A and 3B, the vacuum valve 200 according to the present example embodiment may include a valve flange 210 having a valve seat 215, the valve body 220 disposed in, e.g., inside, the valve flange 210 and having a contact surface 220S capable of contacting the valve seat 215, the disk 240 disposed on the contact surface 220S of the valve body 220, and an actuator 270 applying a driving force to the valve body 220. For example, as illustrated in FIG. 3A, the valve body 220 may be on a first surface of the actuator 270, and the valve flange 210 may be attached to the first surface of the actuator 270 while surrounding, e.g., enclosing, the valve body 220.

The valve flange 210 may include a first port 211 and a second port 212, and the first and second ports 211 and 212 may be respectively connected to the first and second exhaust lines 140 and 150 to provide a flow path for vacuum pumping. The first port 211 and the second port 212 may be arranged in a substantially vertical direction, e.g., the first and second ports 211 and 212 may extend perpendicularly to each other. For example, as illustrated in FIG. 3A, the first port 211 of the valve flange 210 may be positioned opposite to the side of the valve flange 210 that is connected to the actuator 270, and the second port 212 of the valve flange 210 may be positioned on a side of the valve flange 210 between the first port 211 and the actuator 270.

The valve seat 215 of the valve flange 210 may be disposed, e.g., directly, on the first port 211, e.g., the valve seat 215 may be a surface within the valve flange 210 that faces the valve body 220. For example, as illustrated in FIG. 3A, the valve body 220 may be between the actuator 270 and the valve seat 215. The valve body 220 may be configured to be in contact with the valve seat 215 by the actuator 270 or to be separated from the valve seat 215, and may open or block the flow path between the first and second exhaust lines 140 and 150 by such contact and separation. That is, the valve body 220 may be moveable by the actuator 270 toward the valve seat 215 or away from the valve seat 215 to control blocking or opening, respectively, of the flow path between the first and second exhaust lines 140 and 150. For example, as illustrated in FIG. 3B, the valve body 220 may be moveable by the actuator 270 toward the valve seat 215 so the contact surface 220S of the valve body 220 directly contacts the valve seat 215, thereby blocking the first port 211.

In detail, as illustrated in FIG. 3A, when the valve body 220 is separated from the valve seat 215, the disk 240 located on the contact surface 220S of the valve body 220 may be spaced apart from the valve seat 215, so the flow path from the first port 211 to the second port 212 is open (see dashed arrows in FIG. 3A). As illustrated in FIG. 3B, when the valve body 220 contacts the valve seat 215, the disk 240 located on the contact surface 220S of the valve body 220 is positioned in the first port. As illustrated in FIGS. 3A and 3B, a length of the valve body 220 in the vertical direction of the figures is larger than a length of the inner opening of the first port 211, i.e., an opening of the first port 211 as measured between facing edges of the valve seat 215, to ensure blocking of the flow path from the first port 211.

The disk 240 employed in the present example embodiment may have an inclined surface 240S that is inclined, e.g., slanted, toward the second port 212, e.g., a thickness of the disk 240 from its flat surface (which contacts the contact surface 220S) to the inclined surface 240S may be reduced as a distance from the second port 212 is reduced. The inclined surface 240S of the disk 240 may be inclined at an angle θ with respect to the contact surface 220S of the valve body 220 (see FIG. 5B). For example, the angle θ may be in a range of 5° to 20° with respect to the contact surface 220S of the valve body 220, e.g., the angle θ may be in a range of 10° to 15° with respect to the contact surface 220S (see FIG. 5B). The inclined surface 240S may promote a smooth gas flow when the vacuum valve 200 is opened, and can prevent a backward flow of particles during the closing process of the vacuum valve 200.

As shown in FIG. 1, the vacuum valve 200 may be configured to be disposed between the chamber 130 and the vacuum pump 180 to control opening (see FIG. 3A) and blocking (see FIG. 3B) of a flow path for discharging gas from the chamber 130. The disk 240 within the valve flange 210 of the vacuum valve 200 may face the first exhaust line 140 of the chamber 130 through the first port 211.

In the present example embodiment, as illustrated in FIGS. 3A and 3B, the actuator 270 may have an output shaft 275 connected to the valve body 220, and may apply a driving force for contact with and separation from the valve seat 215 to the valve body 220 through the output shaft 275. In addition, the vacuum valve 200 may further include a bellows 250 surrounding the output shaft 275. The bellows 250 may be configured to be expanded and contracted according to the driving force of the output shaft 275.

In the present example embodiment, the valve body 220 and the bellows 250 may be mounted on the actuator 270 through a fixing plate 255. For example, the valve flange 210, the valve body 220, and the fixing plate 255 may include a metal material, e.g., stainless steel or carbon steel, to ensure rigidity and pressure resistance.

Referring to FIG. 3A, the valve body 220 may be moved to be separated from the valve seat 215 by the output shaft 275 of the actuator 270. Due to this separation, the valve flange 210 having the valve seat 215 may connect the first port 211 and the second port 212 to secure a flow path for discharging gas. The residual gas discharged from the chamber 130 through this flow path may be discharged toward the vacuum pump 180 (P1→P2).

Referring to FIG. 3B, the valve body 220 may be moved toward the valve seat 215 by the output shaft 275 of the actuator 270 so that the contact surface 220S of the valve body 220 and the valve seat 215 may be in close contact. The contact surface 220S of the valve body 220 may be configured to be bonded to the valve seat 215 provided by a flat cross-section provided around a hollow portion of the first port 211. The valve body 220 may further include an O-ring 225 mounted on the contact surface 220S. The O-ring 225 may include an elastic material, e.g., rubber, that may have a sealing force, e.g., an elastic force, by closely adhering to the valve seat 215.

As described above, by configuring the disk 240 in the vacuum valve 200 to have an inclined surface 240S that is inclined toward the second port 212, which is connected to the vacuum pump 180, it is possible to achieve smooth gas flow through a flow path, as well as suppressing a vortex phenomenon during an opening/closing (particularly, complete closing) operation. As a result, it is possible to effectively reduce particle generation and backflow while improving the gas discharge performance in the chamber 130.

Figure 4:
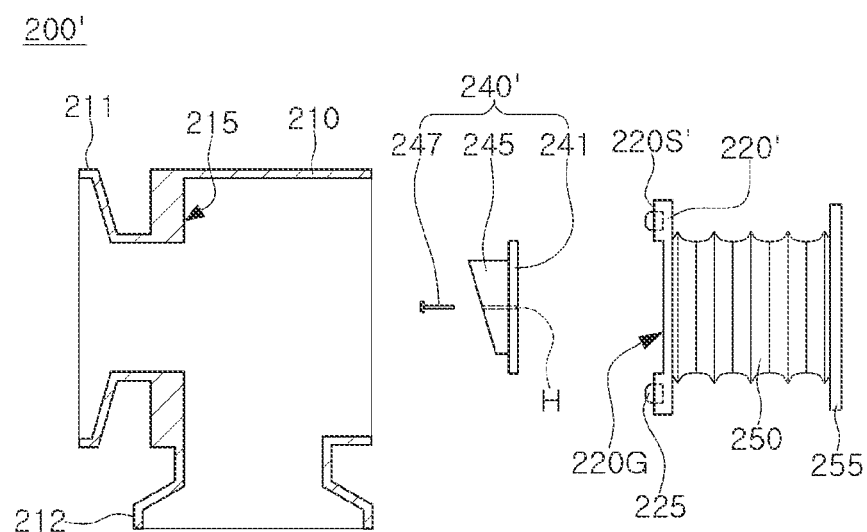
FIG. 4 is an exploded cross-sectional view of a vacuum valve according to an example embodiment.

The configuration of the vacuum valve according to the present example embodiment may be implemented in various structures. FIG. 4 is an exploded cross-sectional view of a valve body 220' according to an example embodiment, and FIGS. 5A and 5B are a perspective view and a cross-sectional view illustrating a disk 240 mounted on the valve body 220' of the vacuum valve 200 of FIG. 4.

Referring to FIG. 4, as each element that can constitute the vacuum valve according to the present example embodiment, the valve flange 210 having the valve seat 215, a disk 240' having the inclined surface 240S, and the valve body 220' having a contact surface 220S' are exploded and shown therein. In the present example embodiment, the disk 240' and the valve body 220' may be configured as separate components that can be combined.

Figure 5A:
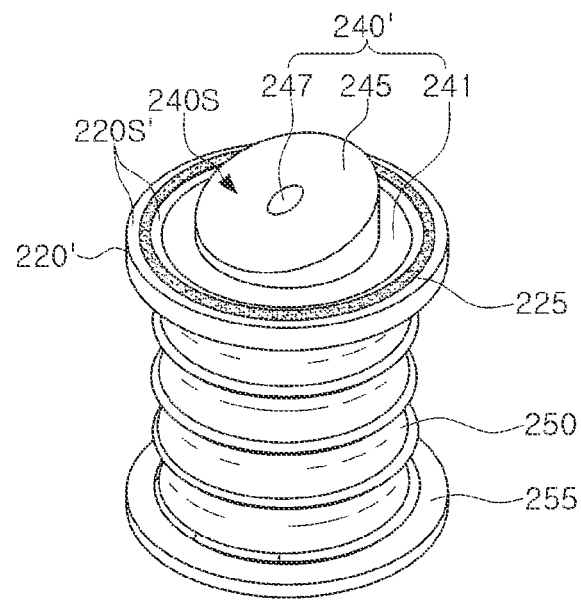
FIGS. 5A and 5B are perspective and cross-sectional views of a disk mounted on a valve body of the vacuum valve of FIG. 4, respectively.
Figure 5B:
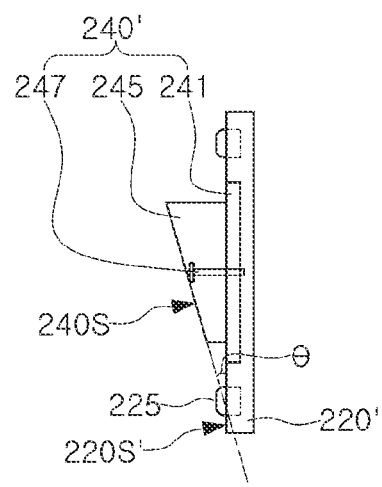

Specifically, referring to FIGS. 5A and 5B together with FIG. 4, the disk 240' employed in the present example embodiment may include a plate 241 having a substantially coplanar surface with the contact surface 220S', and a protrusion 245 disposed on the plate 241, and the inclined surface 240S may be provided as a surface of the protrusion 245. The protrusion 245 may have a smaller diameter than inner diameter of the first port 211. The protrusion 245 may be located inside the first port 211 (FIG. 3A) when the vacuum valve 200' is closed.

The disk 240', i.e., the plate 241, may be disposed in an attachment groove 220G provided on the same surface as the contact surface 220S' of the valve body 220'. As shown in FIGS. 4 and 5B, the plate 241 may be fixed to the valve body 220' through a fastening hole H of the disk 240' by a fastening means 247, e.g., a screw or the like. For example, similar to the valve body 220', the disk 240' may include a metal material, e.g., stainless steel or carbon steel, to ensure rigidity and pressure resistance. The O-ring 225 may be attached on a region of the contact surface 220S' around the disk 240'. As described above, the O-ring 225 may be hermetically bonded to the contact surface 220S of the valve body 220' and to the valve seat 215 to prevent gas leakage when the vacuum valve 200' is closed.

The position of the O-ring 225 is not limited thereto, and may be mounted in other ways. In another example embodiment, the O-ring 225 may be mounted in a manner interposed between the plate 241 of the disk 240' and the attachment groove 220G of the valve body 220'. In addition, unlike in the case of the present example embodiment, the disk 240' and the valve body 220' may be integrally implemented. In this case, the disk 240' providing the inclined surface 240S may be provided in a structure protruding from a region surrounded by the contact surface 220S' (refer to FIGS. 3A and 3B).

As described above, the disk 240' of the vacuum valve 200' may have an inclined surface 240S inclined toward the second port 212 to promote a smooth gas flow through a flow path. At the same time, a vortex phenomenon during the opening and closing operation of the valve may be suppressed.

Figure 6A:
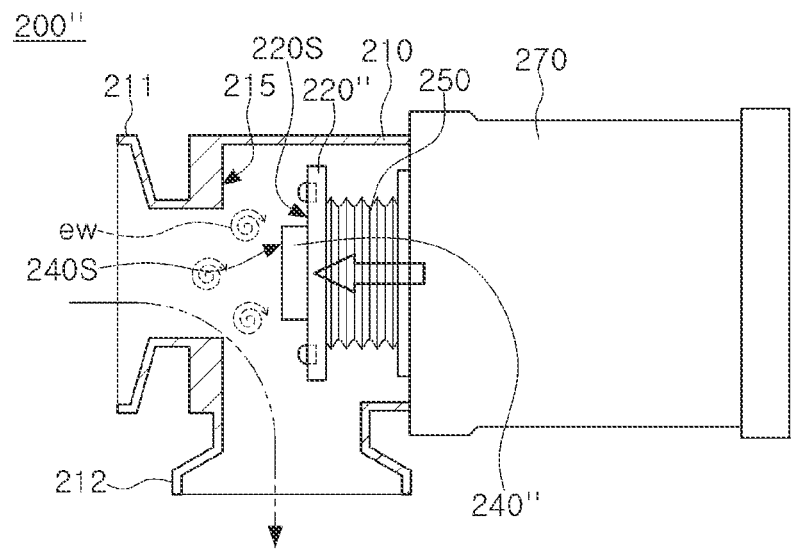
FIGS. 6A and 6B are schematic cross-sectional views of gas flow in a partially opened state of vacuum valves having disks having different structures.
Figure 6B:
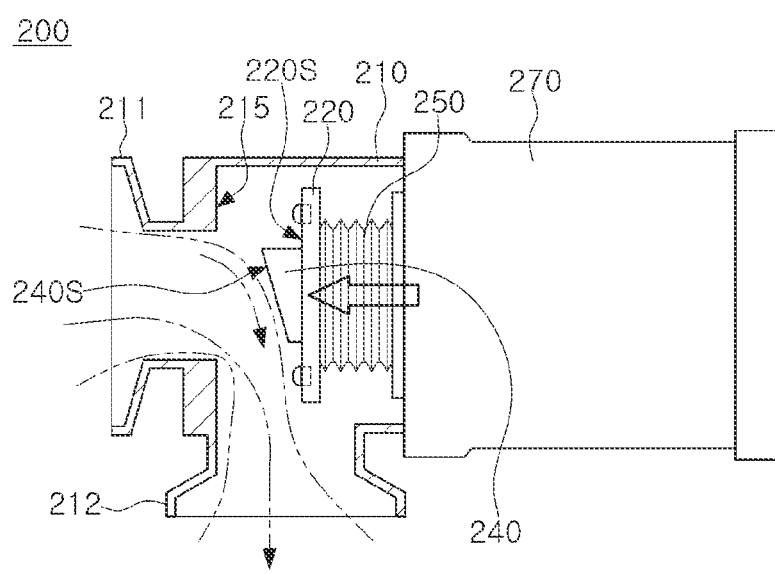

FIGS. 6A and 6B are schematic cross-sectional views illustrating a gas flow in a partially opened state of vacuum valves having disks having different structures. A vacuum valve 200" shown in FIG. 6A has a flat disk 240", and the vacuum valve 200 shown in FIG. 6B has the disk 240 with the inclined surface 240S.

Referring to FIG. 6A together with FIG. 1, in a process of blocking the vacuum valve 200", discharge gas of the chamber 130 is temporarily stagnated inside the vacuum valve 200" due to the flat disk 240" or due to colliding with gas particles deflected from the flat disk 240" to generate a vortex (ex) of air flow. Momentum due to such stagnation and vortex may be transmitted to subsequent gas particles, resulting in a hammering phenomenon, i.e., when momentum of a fluid changes rapidly, which can cause a rapid increase in pressure in the tube or cause vibration. As a result, particles that are process by-products in the chamber 130 may not be smoothly discharged, but rather, additional particles may be generated in the chamber 130 due to backflow. Such particles may cause defects during processing of thin films in the chamber 130.

In contrast, in the vacuum valve 200 illustrated in FIG. 6B, the surface of the disk 240 located on the contact surface 220S of the valve body 220 may be configured to be inclined toward the second port 212, such that even in a blocking process (partial opening) of the vacuum valve 200, e.g., as compared to FIG. 6A, the gas flow may not be greatly disturbed, a relatively smooth gas flow may be achieved, and the vortex phenomenon can be greatly suppressed. As a result, it is possible to effectively reduce the generation of particles and backflow while improving the gas discharge performance in the chamber 130. This will be described in more detail with reference to FIGS. 7 to 12.

In detail, in order to prevent or substantially minimize stagnation and backflow caused by collision between gas particles and a flat disk, embodiments provide a method in which a collision angle with gas particles is reduced and a stagnation and backflow phenomenon is minimized by configuring the disk to be inclined toward the vacuum pump, i.e., the second port. An optimized inclination angle may be determined, e.g., derived, in terms of conductance and flow rate increase in the vacuum valve.

The semiconductor manufacturing apparatus used in the present example embodiment used a batch-type atomic layer deposition (ALD) apparatus (DJ1206VN manufactured by KE), similar to the structure shown in FIG. 1. The vacuum valve 200 of FIGS. 3A and 3B was used as an auto pressure controller (APC). When 2.8 liters of gas per minute was introduced through the vacuum valve, conductance and flow rate were measured while increasing an angle of inclination (θ in FIG. 5B) of the disk 240 from 0° (Comparative Example: flat surface) to 15°.

Figure 7:
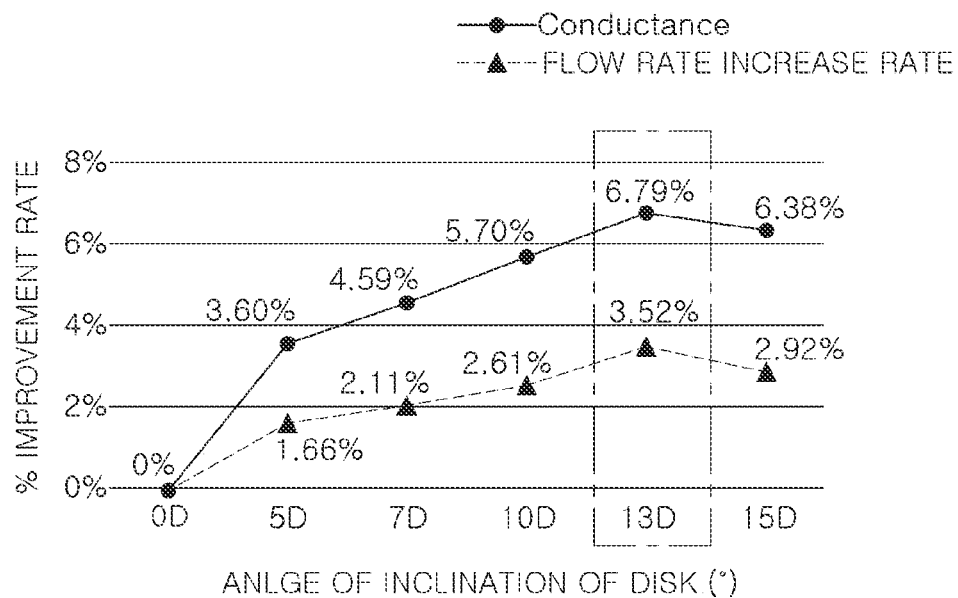
FIG. 7 is a graph of the increase rate of conductance and flow rate inside the vacuum valve according to the angle of inclination of the disk.

As shown in FIG. 7 and Table 1, it was confirmed that conductance and flow rate were significantly changed according to the angle of inclination of the disk 240. As the angle of inclination of the disk increased to 5°, 7°, 10°, and 13° (indicated as 5D, 7D, 10D, and 13D in the graph of FIG. 7), the conductance and flow rate also increased. Further, it was confirmed that the conductance and flow rate decreased as the angle increased beyond 13°. In order to increase the angle of inclination of the disk 240 to be larger than 13°, the thickness of the disk 240 of the same area must be increased. However, an increase in the volume of the disk 240 may decrease conductance. The flow was measured in standard liters per minute (slm).

TABLE 1

|  | Angle of inclination | | | | | |
| --- | --- | --- | --- | --- | --- | --- |
|  | REF (0°) | 5° | 7° | 10° | 13° | 15° |
| Inflow flow (slm) | 2.8 | 2.8 | 2.8 | 2.8 | 2.8 | 2.8 |
| P1 (Pa) | 56.4 | 55.7 | 55.5 | 55.3 | 55.1 | 55.2 |
| P2 (Pa) | 35.7 | 35.7 | 35.7 | 35.7 | 35.7 | 35.7 |
| P1 − P2 (Pa) | 20.7 | 20 | 19.8 | 19.6 | 19.4 | 19.5 |
| Conductance (l/s) | 0.229 | 0.237 | 0.239 | 0.242 | 0.244 | 0.243 |
| Flow rate @P1 (m/s) | 58.7 | 59.7 | 59.9 | 60.2 | 60.8 | 60.4 |

As described above, when an angle of inclination of the disk 240 is in a range of 5° to 20°, preferably in the range of 10° to 15° (especially 13°), sufficient particle generation and countercurrent improvement effects can be described through improvement of conductance and flow rate.

In order to confirm various actions and effects according to embodiments, the performance of a vacuum valve having a disc angle of inclination of 13° (Example) and a vacuum valve having a flat disc of 0° (Comparative Example) were compared and evaluated.

Figure 8:
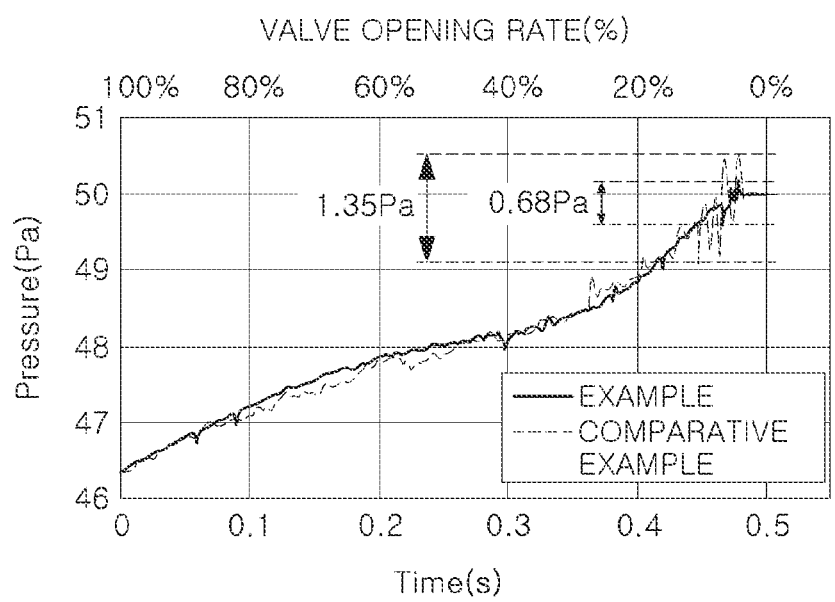
FIG. 8 is a simulation analysis result of a pressure on a disk surface during a closing operation of a vacuum valve according to an example embodiment.

First, a change in pressure on a surface of the disk during the closing operation of the vacuum valve according to the Example (13°) and the vacuum valve according to the Comparative Example (0°) was simulated. FIG. 8 shows a result of analyzing a simulation by comparing the pressure at the first port during the closing operation of the vacuum valve according to the Example under the same conditions as those of the Comparative Example.

Referring to FIG. 8, it was found that a pressure swing width of the first port (P1) decreased by about 42% from 1.35 Pa (Comparative Example) to 0.68 Pa (Example) for 0.5 seconds of operation time. This reduction can be understood as a result of a reduction in hammering phenomenon as the number or momentum of gas particles reflected from the inclined cross-section of the disk decreases while the vacuum valve is closed, and the gas is discharged more smoothly.

Next, a change in the internal pressure of the chamber was measured during the fully opened operation from the fully closed to the vacuum valve according to the Example (13°) and the Comparative Example (0°).

Figure 9:
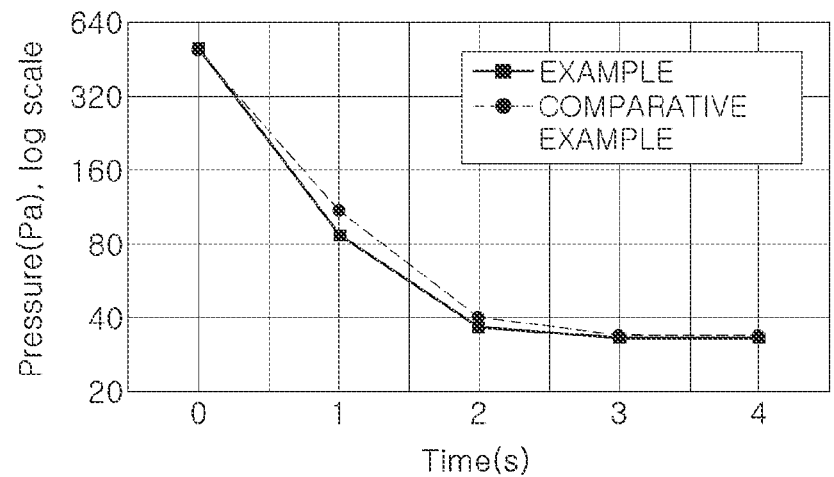
FIG. 9 is a graph of a change in chamber pressure during a fully closed operation to a fully open operation of a vacuum valve according to an example embodiment.

FIG. 9 is a graph comparing the internal pressure change of the chamber for each time period after switching from the closed state (490 Pa) to the open state (32 Pa) in the vacuum valve according to the Example and the Comparative Example. Table 2 below shows a change in an exhaust rate for each time period according to the valve switching.

TABLE 2

| Classification | 1 s | 2 s | 3 s | 4 s |
|---|---|---|---|---|
| REF (0° disk) | 382.1 | 69 | 6.1 | 0.3 |
| 13° disk | 412.1 | 50.5 | 3.9 | 0.3 |

Referring to FIG. 9, in the vacuum valve according to the Example, an exhaust rate within an initial 0 to 1 second interval after an opening operation was 412.1 Pa/s, which was confirmed to be improved by about 7.86% than 382.1 Pa/s of the vacuum valve according to the Comparative Example. In particular, as shown in Table 2, it was possible to substantially improve the exhaust rate in the vacuum valve according to the Example. As described above, the vacuum valve according to the Example may more smoothly discharge residual precursors and process by-products to suppress the generation of particles, and discharge particles that have already been generated more smoothly.

Figure 10:
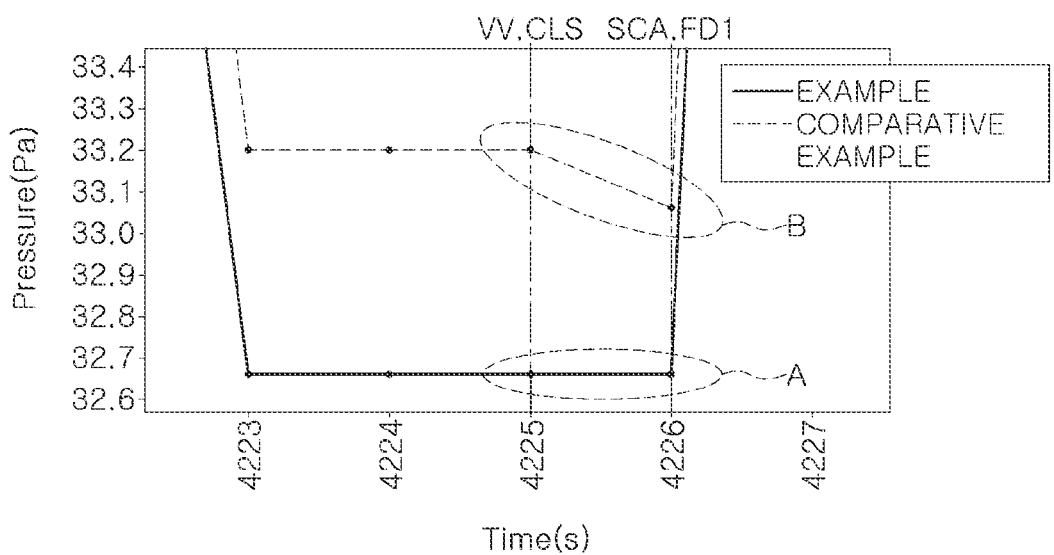
FIG. 10 is a graph of a behavior of a chamber pressure change in a pressure change section by a vacuum valve according to an example embodiment.

FIG. 10 shows a result of observing a transient pressure behavior in a process in which the pressure of the chamber is changed by the vacuum valve according to the Example and the Comparative Example.

Referring to FIG. 10, in the vacuum valve according to the Comparative Example, a phenomenon of pressure temporarily dropping to 33.06 Pa at the time at which the pressure in the chamber was changed from 33.2 Pa to 490 Pa occurred. It was found that the pressure decreased due to the occurrence of back pressure at the moment when the valve was closed (indicated by "B"), but in the vacuum valve according to the Example, as indicated by A in the same section, there was almost no drop in pressure. As described above, it was confirmed that the disk having an inclined surface greatly suppressed the generation of back pressure when the valve was closed.

Figure 11A:
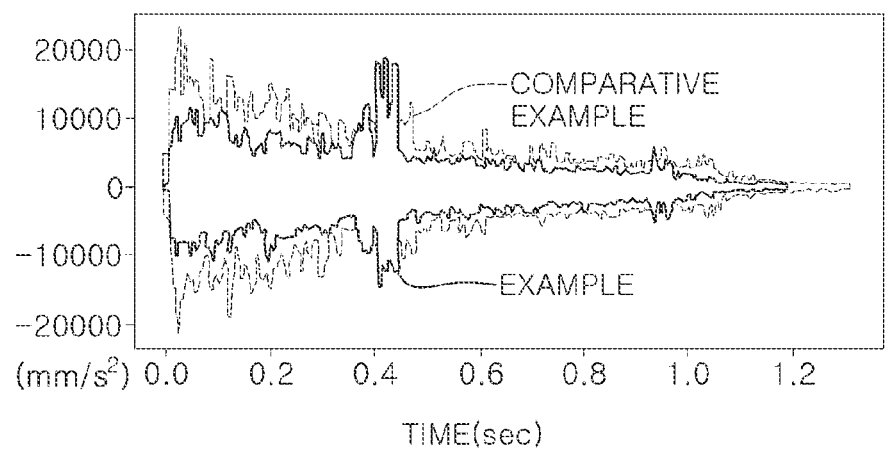
FIGS. 11A and 11B are graphs of vibrations when a vacuum valve is closed and opened, respectively, according to an example embodiment.
Figure 11B:
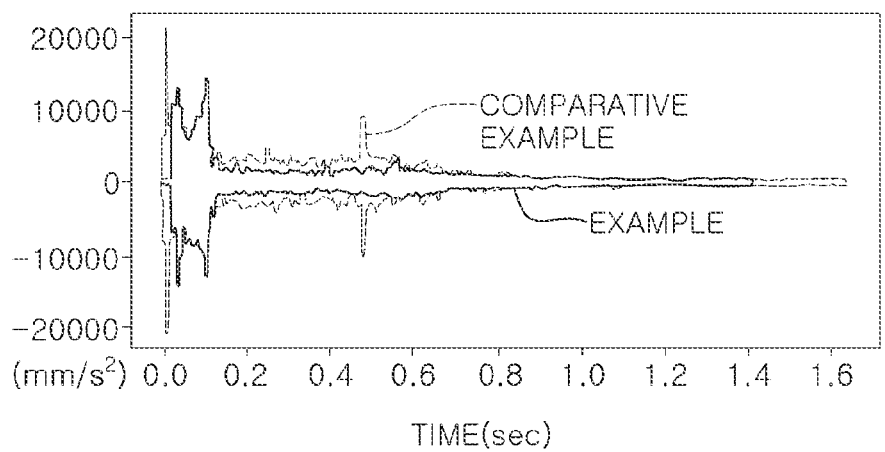

FIGS. 11A and 11B show results of measuring and comparing vibrations during closing and opening of a vacuum valve according to an Example and a Comparative Example, respectively.

Referring to FIGS. 11A and 11B, it can be seen that the vibration during closing and opening of the vacuum valve according to the Example is significantly reduced than that of the Comparative Example. In particular, vibrations occurring when the vacuum valve according to the Example is closed were reduced by about 50%, as compared to the vibrations in the Comparative Example. Due to such a reduction in vibrations, it can be expected that additional generation of particles and/or backward flow of particles due to back pressure can be prevented or substantially minimized.

Figure 12:
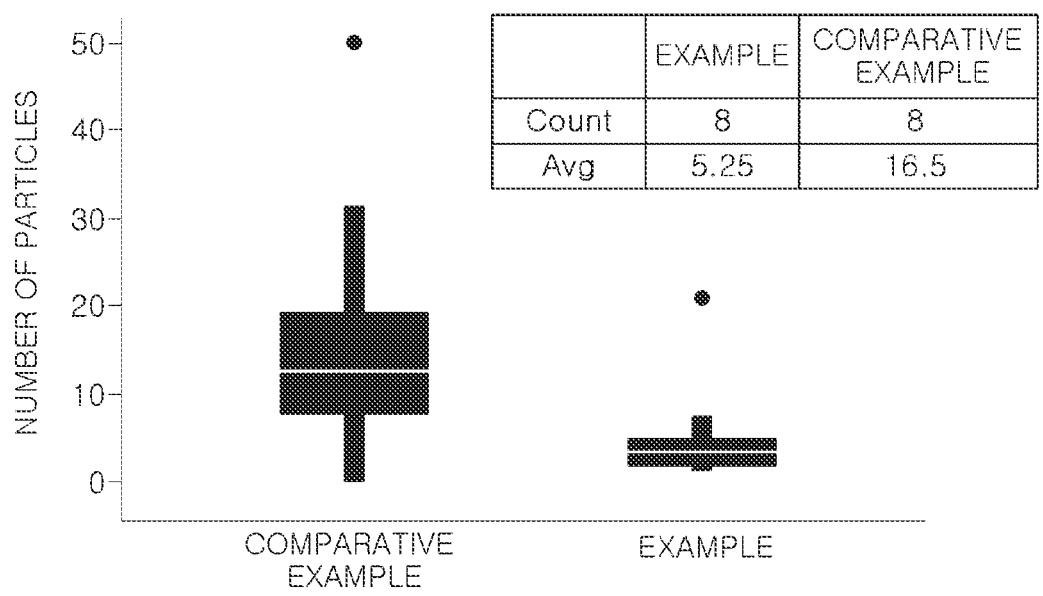
FIG. 12 is a graph of a particle measurement result of a semiconductor manufacturing apparatus according to an example embodiment.

FIG. 12 shows a result of measuring the number of particles measured in ALD apparatuses to which vacuum valves according to the Examples and Comparative Examples are respectively applied. In each condition, the number of particles was measured immediately after the PM of the mass production facility.

Referring to FIG. 12, it shows the distribution of the number of particles for 8 samples under the same condition. When the vacuum valve according to the Comparative Example was applied, the average number of particles was 16.5, but when the vacuum valve according to the Example was applied, it was reduced to 5.25, which was confirmed to be improved by about 68.2%.

As described above, by making a surface of the disk of the vacuum valve have a surface inclined toward the second port (vacuum pump) side, gas discharge in the chamber may minimize interference by the disk, thereby increasing an exhaust efficiency. Further, during the opening and closing operation of the valve, an occurrence of back pressure may also be greatly suppressed. In particular, in the case of periodically repeating rapid pressure fluctuations, e.g., a vacuum valve of an ALD apparatus, an improvement of exhaust characteristics by the vacuum valve according to embodiments may rapidly discharge residual gas, and at the same time, reduce a hammering phenomenon, thereby greatly reducing contamination of wafers in the chamber and thin film particles.

The gas flow in the vacuum valve can be changed using not only an inclined surface but also various types of uneven surfaces, and positive effects can be expected in discharge performance and prevention of backflow. FIGS. 13A to 15B illustrate various types of disks that may be employed in the vacuum valve according to the above-described embodiments.

Figure 13A:
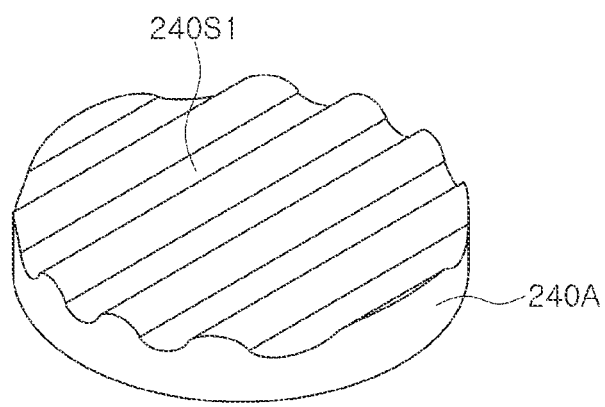
FIGS. 13A and 13B are perspective and cross-sectional views, respectively, of a disk applicable to a vacuum valve according to an example embodiment.
Figure 13B:

Referring to FIGS. 13A and 13B, a disk 240A according to the present example embodiment may have a surface 240S1 having a plurality of curved portions, e.g., to face the first exhaust line 140 of FIG. 1. Depending on a period, e.g., interval, and direction of these curved portions, a gas flow in a vacuum valve may be affected.

Figure 14A:
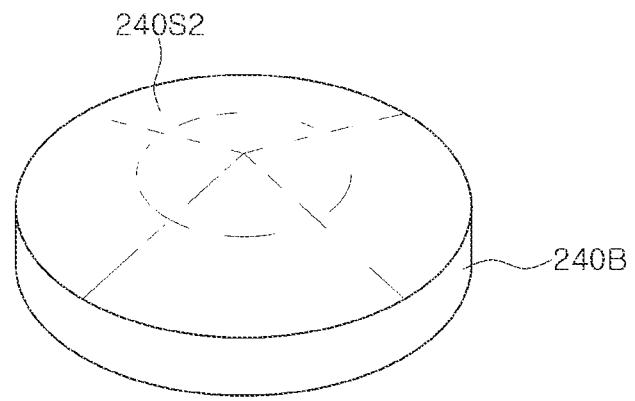
FIGS. 14A and 14B are perspective and cross-sectional views, respectively, of a disk employable in a vacuum valve according to an example embodiment.
Figure 14B:
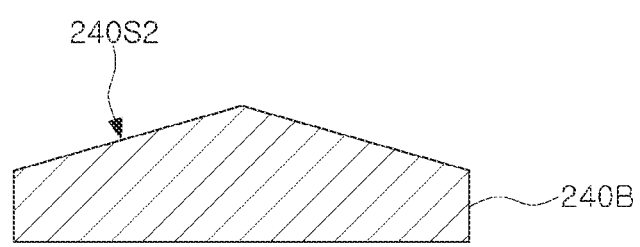

Referring to FIGS. 14A and 14B, a disk 240B according to the present example embodiment may have a surface 240S2 having a conical structure, e.g., to face the first exhaust line 140 of FIG. 1. An inclined surface provided by the conical structure may help a smooth gas flow, and may improve back pressure caused by collisions with gas particles.

Figure 15A:
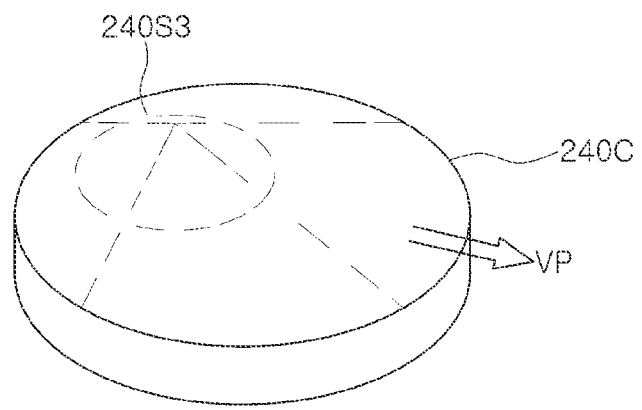
FIGS. 15A and 15B are perspective and cross-sectional views, respectively, of a disk applicable to a vacuum valve according to an example embodiment.
Figure 15B:
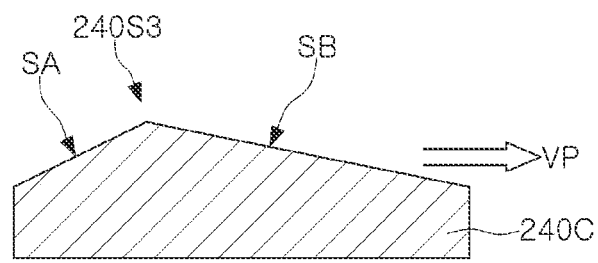

Referring to FIGS. 15A and 15B, a disk 240C according to the present example embodiment may include a surface 240S3 having a lower region SB inclined toward a vacuum pump VP side, and an upper region SA inclined in a direction opposite to the vacuum pump VP side. Here, the lower region SB may have an area, larger than an area of the upper region SA.

Similar to the structure described in FIG. 4, the disk structure described above may have a plate having a substantially coplanar surface with the contact surface of the valve body and a protrusion disposed on the plate and having the non-flat surface. In addition, the protrusion may have a diameter smaller than an inner diameter of the first port, and may be disposed inside the first port.

By way of summation and review, in a process of controlling pressure with a vacuum valve, unwanted particles may be generated in the vacuum chamber, or particles may flow back into the vacuum chamber from an exhaust pipe, resulting in a process failure. Therefore, an aspect of embodiments provides a vacuum valve capable of reducing particle generation and backflow, as well as a semiconductor manufacturing apparatus capable of reducing particle generation and backflow in a process of opening and closing a vacuum valve. That is, as set forth above, according to embodiments, by improving a shape of a disk of a vacuum valve for controlling vacuum pressure, it is possible to effectively reduce particle generation and backflow by improving a discharge performance of gas and suppressing an vortex phenomenon.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vacuum valve, comprising:
   a valve flange having an inlet port, an outlet port, and a valve seat in a space between the inlet port and the outlet port;
   a valve body in the valve flange, the valve body having a contact surface facing the valve seat and the inlet port, and the valve body being moveable to have the contact surface in contact with the valve seat and to be separated from the valve seat;
   a disk on the contact surface of the valve body, the disk having a flat surface in contact with the contact surface and an inclined surface opposite the flat surface and inclined toward the outlet port, a thickness of the disk from the flat surface to the inclined surface being reduced as a distance from the outlet port is reduced; and
   an actuator connected to the valve flange, the actuator being configured to apply a driving force to the valve body to move the contact surface of the valve body into or out of contact with the valve seat.

2. The vacuum valve as claimed in claim 1, wherein, when the contact surface is in contact with the valve seat, the disk is configured to be in the inlet port, sidewalls of the disk are spaced apart from inner sidewalls of the first port, and a portion of the contact surface surrounding the disk is exposed to the inside of the first port.

3. The vacuum valve as claimed in claim 1, wherein the inclined surface of the disk is inclined at an angle of 5° to 20° with respect to the contact surface.

4. The vacuum valve as claimed in claim 3, wherein the inclined surface of the disk is inclined at an angle of 10° to 15° with respect to the contact surface.

5. The vacuum valve as claimed in claim 1, further comprising a bellows between the valve body and the actuator, the actuator having an output shaft connected to the valve body to apply the driving force to the valve body, and the bellows surrounding the output shaft.

6. The vacuum valve as claimed in claim 1, wherein the disk includes:
   a plate having a substantially coplanar surface with the contact surface; and
   a protrusion on the plate, the protrusion having the inclined surface.

7. The vacuum valve as claimed in claim 6, wherein a diameter of the protrusion is smaller than an inner diameter of the inlet port.

8. The vacuum valve as claimed in claim 1, further comprising an O-ring on the contact surface around the disk, the O-ring including an elastic material exhibiting an elastic force.

9. The vacuum valve as claimed in claim 1, wherein, in the valve flange, the inlet port is arranged in a substantially perpendicular direction to the outlet port.

10. A vacuum valve, comprising:
    a valve flange having a first port, a second port, and a valve seat on a flow path between the first and second ports;
    a valve body in the valve flange, the valve body having a contact surface configured to block the flow path when contacting the valve seat, and configured to allow the contact surface to be separated from the valve seat;
    a disk on the contact surface of the valve body, the disk having a first surface in contact with the contact surface and a second surface opposite the first surface, the second surface being a non-flat surface configured to be in the first port when the contact surface is in contact with the valve seat;
    an actuator having an output shaft connected to the valve body, the actuator being configured to apply a driving force to the valve body through the output shaft; and
    a bellows surrounding the output shaft, the bellows being configured to expand and contract according to the driving force.

11. The vacuum valve as claimed in claim 10, wherein the non-flat surface of the disk has a plurality of curved portions.

12. The vacuum valve as claimed in claim 10, wherein the non-flat surface of the disk has a conical structure.

13. The vacuum valve as claimed in claim 10, wherein the non-flat surface of the disk has a lower region inclined toward the second port and an upper region inclined in a direction opposite to the second port.

14. The vacuum valve as claimed in claim 13, wherein the lower region has an area larger than that of the upper region.

15. The vacuum valve as claimed in claim 10, wherein the disk includes:
    a plate having a substantially coplanar surface with the contact surface; and
    a protrusion on the plate and having the non-flat surface, a diameter of the protrusion being smaller than an inner diameter of the first port.

16. A semiconductor manufacturing apparatus, comprising:
    a chamber having an internal space to accommodate a wafer;
    a reactive gas supply line connected to the chamber, the reactive gas supply line to supply a reactive gas to the chamber;
    a vacuum pump to externally pump a residual gas out of the chamber;
    a first exhaust line connected to the chamber;
    a second exhaust line connected to the vacuum pump; and
    a vacuum valve between the first exhaust line and the second exhaust line, the vacuum valve being configured to open and close a flow path of the residual gas between the first exhaust line and the second exhaust line, and the vacuum valve including:

a valve flange having:
- a first port connected to the first exhaust line, the first port being an inlet port,
- a second port connected to the second exhaust line, the second port being an outlet port, and
- a valve seat adjacent to the first port,
- a valve body in the valve flange, the valve body having a contact surface facing the valve seat and the first port, and the valve body being moveable to have the contact surface in contact with the valve seat and to be separated from the valve seat,
- a disk on the contact surface of the valve body, the disk having a flat surface in contact with the contact surface and an inclined surface opposite the flat surface and inclined toward the second port, a thickness of the disk from the flat surface to the inclined surface being reduced as a distance from the second port is reduced, and
- an actuator connected to the valve flange, the actuator being configured to apply a driving force to the valve body to move the contact surface of the valve body into or out of contact with the valve seat.

17. The semiconductor manufacturing apparatus as claimed in claim 16, wherein the disk is configured to be positioned in the first port when the contact surface is in contact with the valve seat.

18. The semiconductor manufacturing apparatus as claimed in claim 16, wherein:
   the first port is arranged in a substantially perpendicular direction to the second port, and
   the inclined surface of the disk is inclined at an angle of 10° to 15° with respect to the contact surface.

19. The semiconductor manufacturing apparatus as claimed in claim 16, wherein the disk includes:
   a plate having a substantially coplanar surface with the contact surface; and
   a protrusion on the plate, the protrusion having the inclined surface, and a diameter of the protrusion being smaller than an inner diameter of the first port.

20. The semiconductor manufacturing apparatus as claimed in claim 16, wherein the semiconductor manufacturing apparatus is an atomic layer deposition (ALD) apparatus.

* * * * *